(12) United States Patent
Sward

(10) Patent No.: US 6,439,900 B1
(45) Date of Patent: Aug. 27, 2002

(54) SLIDING CONNECTOR INTERFACE WITH NON-METALLIC CONTACTS

(75) Inventor: Douglas Alan Sward, Midvale, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/687,178

(22) Filed: Oct. 13, 2000

(51) Int. Cl.[7] ............................................. H01R 13/44
(52) U.S. Cl. ...................... 439/131; 439/886; 439/951; 174/256
(58) Field of Search ................................ 439/131, 886, 439/951; 174/256, 257

(56) References Cited

U.S. PATENT DOCUMENTS

| | | | |
|---|---|---|---|
| 2,916,720 A | 12/1959 | Steans | 339/91 |
| 3,700,510 A | * 10/1972 | Keene et al. | 174/256 |
| 4,186,988 A | 2/1980 | Kobler | 339/176 MP |
| 4,241,974 A | 12/1980 | Hardesty | 339/154 A |
| 4,303,296 A | 12/1981 | Spaulding | 339/122 R |
| 4,352,492 A | 10/1982 | Smith | 273/1 GC |
| 4,407,559 A | 10/1983 | Meyer | 339/126 R |
| 4,428,636 A | 1/1984 | Kam et al. | 339/97 P |

(List continued on next page.)

FOREIGN PATENT DOCUMENTS

| | | |
|---|---|---|
| EP | 0 355 413 | 7/1989 |
| JP | 58-34370 | 5/1983 |
| JP | 61-256850 | 11/1986 |
| WO | WO 95/13633 | 5/1995 |

OTHER PUBLICATIONS

IBM Technical Disclosure Bulletin, "Electrical Connector For Flat Flexible Cable," vol. 25, No. 1, Jun. 1982.

Primary Examiner—Tho D. Ta
Assistant Examiner—Truc Nguyen
(74) Attorney, Agent, or Firm—Workman, Nydegger & Seeley

(57) ABSTRACT

A communication module is provided having a movable electrically conductive interface. This module comprises a printed circuit board with a first slidably receiving contact surface for providing electrical connectivity to the movable electrically-conductive interface, a non-metallic sealant disposed about at least a portion of the first slidably receiving contact surface about which the movable electrically-conductive interface is formed, the sealant imposing negligible resistance to the movable electrically-conductive interface, and a second slidably receiving contact surface for traveling across the sealant disposed about the first slidably receiving contact surface thereby forming the movable electrically conductive interface. Also a method is provided for overlaying the non-metallic sealing element over the first slidably receiving contact surface.

16 Claims, 5 Drawing Sheets

U.S. PATENT DOCUMENTS

| | | | |
|---|---|---|---|
| 4,710,136 A | 12/1987 | Suzuki | 439/374 |
| 4,778,410 A | 10/1988 | Tanaka | 439/676 |
| 4,795,861 A * | 1/1989 | O'Rourke | 200/5 |
| 4,915,648 A | 4/1990 | Takase et al. | 439/490 |
| 5,035,641 A | 7/1991 | Van-Santbrink et al. | 439/329 |
| 5,051,099 A | 9/1991 | Pickles et al. | 439/108 |
| 5,139,439 A | 8/1992 | Shie | 439/359 |
| 5,183,404 A | 2/1993 | Aldous et al. | 439/55 |
| 5,184,282 A | 2/1993 | Kaneda et al. | 361/395 |
| 5,336,099 A | 8/1994 | Aldous et al. | 439/131 |
| 5,338,210 A | 8/1994 | Beckham et al. | 439/131 |
| 5,391,094 A | 2/1995 | Kakinoki et al. | 439/638 |
| 5,411,405 A | 5/1995 | McDaniels et al. | 439/131 |
| 5,481,616 A | 1/1996 | Freadman | 381/90 |
| 5,499,923 A | 3/1996 | Archibald et al. | 439/26 |
| 5,505,633 A | 4/1996 | Broadbent | 439/329 |
| 5,509,811 A | 4/1996 | Homic | 439/55 |
| 5,538,442 A | 7/1996 | Okada | 439/676 |
| 5,547,401 A | 8/1996 | Aldous et al. | 439/676 |
| 5,561,727 A | 10/1996 | Akita et al. | 385/88 |
| 5,562,504 A | 10/1996 | Moshayedi | 439/638 |
| 5,608,607 A | 3/1997 | Dittmer | 361/686 |
| 5,634,802 A | 6/1997 | Kerklaan | 439/131 |
| 5,660,568 A | 8/1997 | Moshayedi | 439/654 |
| 5,667,390 A | 9/1997 | Keng | 439/76.1 |
| 5,667,395 A | 9/1997 | Okada et al. | 439/131 |
| 5,679,013 A | 10/1997 | Matsunaga et al. | 439/144 |
| 5,727,972 A | 3/1998 | Aldous et al. | 439/655 |
| 5,773,332 A | 6/1998 | Glad | 439/344 |
| 5,797,771 A | 8/1998 | Garside | 439/610 |
| 5,816,832 A | 10/1998 | Aldous et al. | 439/131 |
| 6,115,256 A * | 9/2000 | Centofante | 361/737 |

* cited by examiner

SLIDING CONNECTOR INTERFACE WITH NON-METALLIC CONTACTS

BACKGROUND OF THE INVENTION

1. The Field of the Invention

The present invention relates to improved printed circuit boards, and more particularly, to non-metallic sealant elements covering contact surfaces on printed circuit boards.

2. The Relevant Technology

Since printed circuit boards replaced discrete wiring system, there has been a deluge of technology relating to printed circuit boards, and specifically, to the electrical features contained within circuit boards. Printed circuit boards integrated within PC cards provide the necessary interconnect for circuitry to perform its intended electrical functions. For example, in one type of PC card, the circuit board comprises electronics forming a modem that enables the host to receive and transmit information over telephone lines. In another PC card, the circuit board with its electronic components enables the host to receive and transmit information with a network system.

Printed circuit boards are comprised of conductive interconnections or traces that provide conductive "wiring" between components. These conductive interconnects or traces, usually made of copper, are etched from metallic planes on the printed circuit board using known techniques such as photographic and chemical processes. Because of the desire for low-resistance interconnections, these metallic interconnects are generally comprised of copper or related alloys which provide low-resistance at a reasonable cost.

Those familiar with conductive metals, such as copper, appreciate that some conductive metals, and in particular copper, tend to react forming oxidation in an ambient air environment. In fact, copper used on the contact surfaces of printed circuit boards tends to oxidize rapidly. If left unsealed from the ambient air, copper oxidizes forming a less conductive electrical interface for subsequent connector or contact mating, and the oxidation also results in easily detachable copper oxides that are undesirable debris throughout the printed circuit board and surrounding electronics.

While it is known that exposed conductive surfaces may be sealed using many insulative compounds, many surfaces must remain accessible and electrically conductive so that electrical communication between contact surfaces may be achieved and maintained. Thus, conductive sealants are essential for covering those conductive areas that require durable and reliable electrical interfaces.

In addition to the need that contact surface sealants be electrically conductive and thereby exhibit low resistance, sealants covering conductive surfaces that physically engage with other contacts such as connector terminals and the like must be further capable of withstanding repeated physical engagements. For example, physical conductive engagements occur when printed circuit boards having a card-edge connectors are inserted and removed from receiving connectors or jacks. This physical friction-based connector mating requires that any conductive sealant for conductive areas assume a sufficiently "hard" surface that is not easily marred and removed. If such degeneration of the sealed contact surface occurs, then oxidation resumes and conductive debris flakes-off and contaminates and may induce electrical shorts on the printed circuit board and surrounding electronics.

One prominent solution for sealing conductive surfaces involved in continuing physical interfacing has been to apply, usually in the form of plating, other non-oxidizable or less-oxidizable metals to the underlying conductive metal. For example, gold and other heavy metallic elements have been used to coat the copper contact surfaces while maintaining conductivity of the underlying copper contacts. Typically, the copper is plated with a layer of gold, which has an underlayer of nickel. After the gold is applied by plating, it is masked with tape or other physical barrier to prevent any contaminating solder reflow during the application of the electronic components to the printed wiring or electrically conductive traces on the printed circuit board.

Those familiar with plating processes appreciate the various undesirable side-effects of plating and particularly gold plating on small dimension electronic printed circuit boards. For instance, plating copper with gold is expensive because it is process-intensive and involves procedures that may be volatile and result in reduced quality. Gold is also not optimally environmentally sound because a number of toxic chemicals are used to process the gold and are left behind as dangerous by-products.

Furthermore, it is also difficult to plate contacts with metals such as gold and maintain alignment of the sliding contact on top of the etched contact surfaces of the printed circuit board as the plating process results in an additional layer of metal that exhibits sharp profile edges. The nature of copper etching leaves the copper with sharp vertical edges, and when gold is applied, this edge becomes even more pronounced. These edges can affect finely dimensioned interfaces that employ a sliding contact with the plated surface.

For example, a sliding contact interface generally results from a physical sliding of a contacting tab across the plated contact surface. When fine dimensions are involved, the contacting tab and the plated contact surface cannot be subjected to appreciable variations in tolerances otherwise the contacting tab "slips" off the sharp edge of the plated contact surface during the insertion of the connecting tab with the plated contact surface and cannot return to a centered orientation on the plated contact surface due to the steep conductive edge formed on the contact surface by the plating process. That is to say, if the sliding contact becomes misaligned, it is unable to surmount the sharp edges and realign itself. Thus, a need exists to adequately cover the contact surfaces with an element having a more gradually sloping edge. Additionally, if misalignment does occur, the sliding contact should more easily overcome the sloped edges and realign itself.

Others have attempted to solve the problem associated with copper sliding contact surfaces by varying etch widths of the copper, varying the printed circuit board thickness, altering the assembly process, re-configuring contact surfaces, and tightening tolerance controls. Unfortunately, these attempts have been to no avail.

OBJECTS AND SUMMARY OF THE INVENTION

A non-metallic conductive structure, which covers the slidable contact surfaces on printed circuit boards and; (i) enables sufficient hardness, (ii) maintains adequate conductivity, (iii) maintains better alignment between sliding contact surfaces, (iv) reduces oxidation of the contact surfaces and brings about these benefits at a lower cost and with more environmentally-sound techniques than is provided by the available structures and processes.

Thus, in a preferred embodiment, the non-metallic conductive sealant coats the conductive printed circuit board trace, such as a copper contact surface of the printed circuit board. This non-metallic conductive sealant is comprised of a carbon-based ink composition that is preferably applied using a printing process such as a silk-screen process.

The second sliding contact surfaces comprise conductive pins or tabs that interface with the processed traces or contact surfaces on the printed wiring board. One such implementation of a sliding contact is present on a communication card employing a retractable/extendable communication jack such as an XJACK® or other electrical interface. When the extendable jack contact surfaces slide on top of and against the contact surfaces of the printed circuit board, an electrical communication is created. The carbon ink does not insulate the contact surfaces of the printed circuit board, but rather enables conductivity to pass from the underlying conductive copper contact surface to the sliding contact surface.

The use of carbon ink is also more cost-effective and environmentally sound than the use of gold. The application and cost of carbon ink is approximately one-fifth of the price of gold electroplating. The environmental benefits are also substantial. Carbon ink does not have the hazardous side products that are inherent with gold electroplating. Further, carbon ink is more easily applied to contact surfaces, which reduces or eliminates altogether the possibility of solder splash.

Additionally, carbon ink has desirable characteristics that make it well suited for its application onto copper contact surfaces. For instance, carbon ink has a greater hardness than gold. Also, carbon ink assumes more gradually sloping edges upon application, which make misalignment less probable and problematic.

These and other objects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above recited and other advantages and objects of the invention are obtained, a more particular description of the invention will be illustrated in the appended drawings. Understanding that these drawings depict only typical embodiments of the invention and are not therefore to be considered to be limiting of its scope, the invention in its presently understood best mode for making and using the same will be described and explained with additional specificity and detail through the use of the accompanying drawings in which.

DETAILED DESCRIPTION OF THE PREFERRED EMBODIMENTS

The present invention relates primarily to a non-metallic conductive element, such as carbon ink, which is applied to slidable contact surfaces on printed circuit boards, and which enhances electrical communication when the contact surfaces are in sliding contact with one other. The term "non-metallic" as used herein, as relating to conductive elements, sealants, or coatings implies, a non-metal-based substance such as carbon used to formulate coating such as carbon ink for use in sealing electrically conductive contacts or traces, such as copper, from oxidation. Such non-metallic base compositions may be further comprised of metallic, such as silver, additives and still remain within the scope of "non-metallic" as sued herein.

Those of skill in the art appreciate that electrical continuity results when the contact surfaces of the printed circuit board slide against contact surfaces from other electrical connectors. The non-metallic conductive sealant may exhibit characteristics of increased hardness, improved conductivity, better maintenance of alignment and better accompanying cost and environmental benefits than other metallic plating prior solutions.

Figure 1:
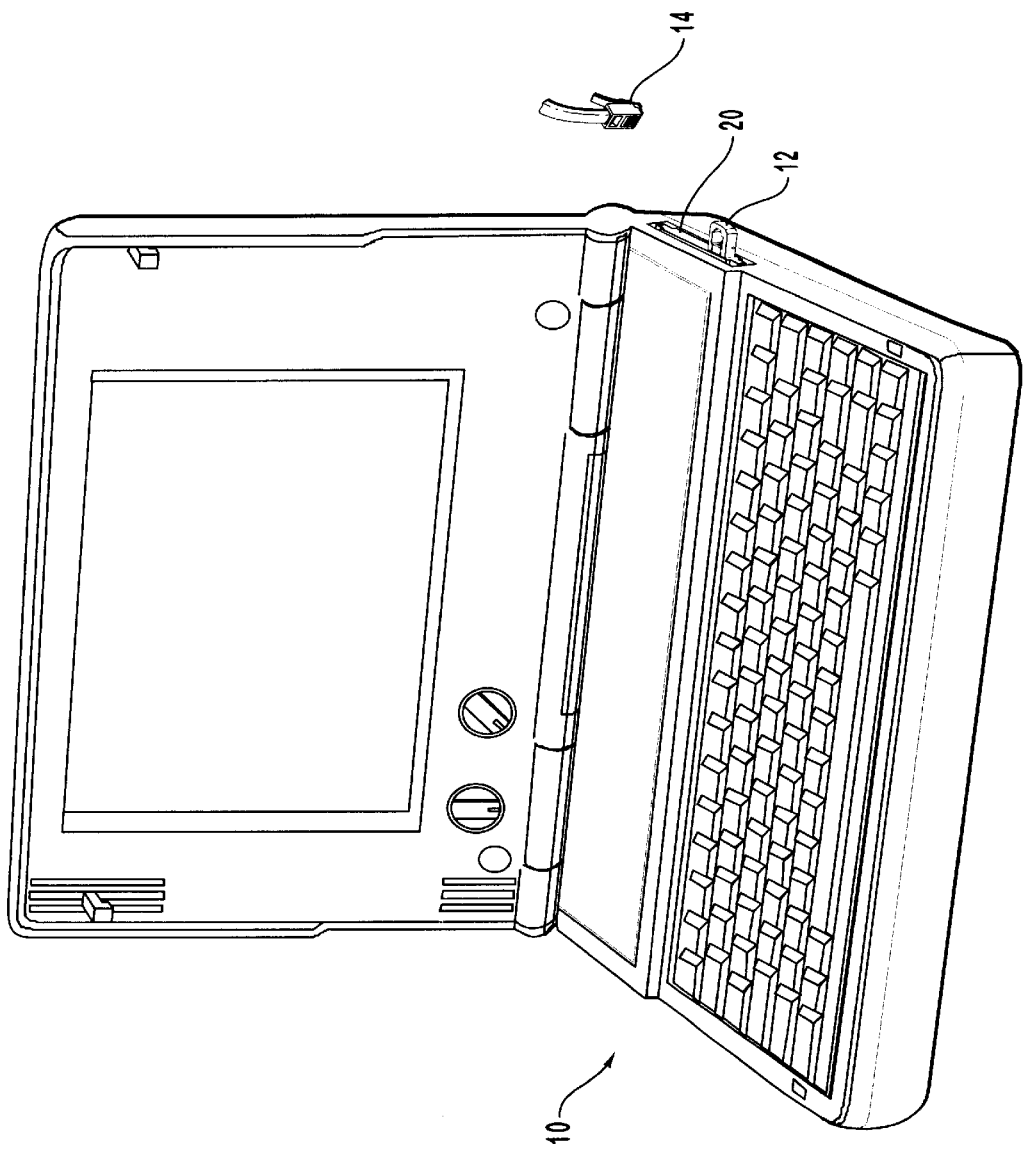
FIG. 1 depicts a perspective view of an environment within which the present invention may be practiced.

FIG. 1 depicts one environment in which the present invention may be practiced. In FIG. 1 a data device, depicted as computer 10, incorporates various electronic components including electronic components resident on printed circuit boards. Those of skill in the art appreciate that printed circuit boards are manufactured through processes wherein various layers of metallic interconnect are created for providing the wiring of electronic components into circuits that perform specific functions. Those of skill in the art further appreciate that it is desirable to have interconnections between the various electrical components that exhibit very low resistances and therefore do not interfere with the electrical performance of the components comprising the various circuits. Therefore, as described above, metallic interconnects such as copper are highly desirable.

Furthermore, printed circuit boards and the circuitry associated therewith are designed to perform specific functions, and are frequently designed to interface with external devices such as network or other data devices. In order to facilitate the interfacing of these circuits with other devices, connector arrangements have been developed which facilitate coupling between devices.

FIG. 1 depicts computer 10 having an integrated form-factor such that a connecting interface, depicted as sliding interface electrical connector 12 extends therefrom for facilitating the interconnection of computer 10 with an external network or device via a media plug 14. As depicted, sliding interface electrical connector 12 extends or protrudes from computer 10 for facilitating the coupling of the internal electronic circuitry within computer 10, or alternatively within electronic modules directly coupled to slidable connector 12. It should be apparent, that when computer 10 is not desirably coupled via media plug 14 to a network, sliding interface electrical connector 12 undesirably protrudes from computer 10. It would be desirable, and is in accordance with the present invention, to form a slidable connector interface between sliding interface electrical connector 12 and internal printed circuit boards such that sliding interface electrical connector 12 may be received or recessed into a stowage position within a chassis or housing such as computer 10.

Figure 2:
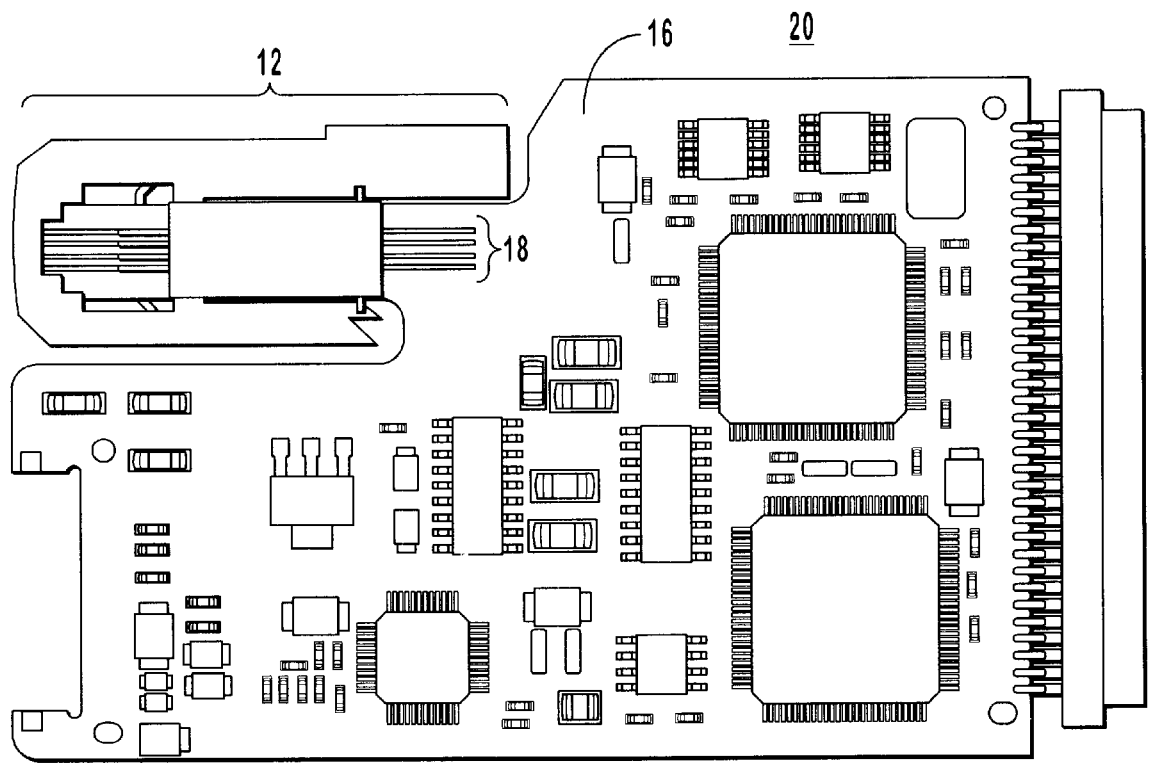
FIG. 2 depicts a top view of a printed circuit board having a sliding contact interface thereon, in accordance with a preferred embodiment of the present invention.

FIG. 2 depicts a printed circuit board 16 having electronic components thereon which are interconnected through wiring tracks (not shown) which, as described above, perform the function of wiring various circuit components into specific desirable circuit functions. For illustration purposes, printed circuit board 16 is depicted as having a form-factor in accordance with the PCMCIA module standard. Such a depiction is illustrative and not limiting of the scope of the present invention. A portion of circuitry on printed circuit board 16 functions to provide an interface both physically and electrically through additional conductive tracks (FIG. 3) which couple both mechanically and electrically via sliding interface electrical connector 12 to media plug 14 (FIG. 1) and hence networks and other circuitry connected by media plug 14. FIG. 2 depicts a portion of these interconnecting printed wires as conductive tracks 18. A sliding interface electrical connector for ultimately providing electrical communication between a media connector and a computer is depicted generally as 12.

Figure 3:
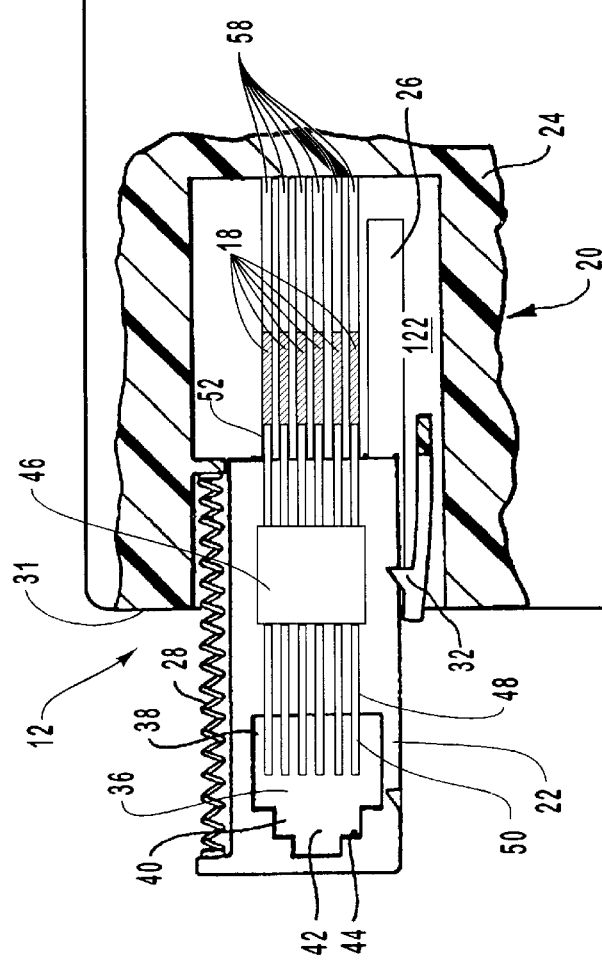
FIG. 3 depicts a sliding contact interface having a carbon ink sealant thereon, in accordance with a preferred embodiment of the present invention.

With reference to FIG. 3, the sliding interface electrical connector 12 is defined by, for example, a communications card 20 having a retractable access portion 22 and a fixed portion 24. The fixed portion 24 is in electrical communication with the computer by means of electronic circuitry connected on printed circuit board 16 housed internally within the communications card 20. As used herein, fixed portion 24 shall refer to the generally stationary features internal to the communications card. Such features include, but are not limited to, the PCB including the interconnecting conductive traces, the electronic circuitry thereon, the mechanical spacers and connectors used to physically connect the PCB to the communications card. The retractable access portion 22 is in electrical communication with fixed portion 24 through the sliding interface electrical connector 12, described in detail below.

During use, in means shown, the retractable access portion 22 slides in and out of a slot 26 formed within the fixed portion 24. The retractable portion 22 is urged out of the slot 26 by a spring 28 biased to the fixed portion 24. Although not shown, the computer housing is substantially parallel to an edge 31 of the communications card 20 during use. A biased mechanism 32 may be used to restrict the travel distance of the retractable access portion 22 to a predetermined distance when the retractable access portion is urged in a direction external to the computer housing by the spring 28. After use, the biased mechanism 32 is used to retain the retractable access portion 22 within the housing of the computer and the housing of the communications card.

An aperture 36 having a plurality of walls 38 is formed within the retractable access portion 22. The aperture 36 is so sized and shaped as to be capable of receiving a media connector. Formed within aperture 36 by means of walls 38 is a broad retention clip groove 40, a narrow retention clip groove 42, and a retention ridge 44. These structures within aperture 36 provide for the retention of a connector pin block of a media connector.

When a user desires to connect a telephone line to the communications card, biased mechanism 32 is manipulated out of a limiting stop. As retractable access portion 22 is released from the grip of biased mechanism 32, tension applied by spring 28 urges retractable access portion 22 out of slot 26. The progress of retractable access portion 22 is guided by portions of the sliding interface electrical connector 12 and is halted when biased mechanism 32 engages another limiting stop. A user then inserts at least a portion of a media connector into aperture 36 to provide an electrical connection between communications card 20 and the telephone line or other network. When a user no longer desires to access the retractable access portion 22, the user merely presses retractable access portion 22 back within the confines of the computer housing until the limiting stop is engaged by biased mechanism 32.

However, it should be appreciated that even further biasing means, aperture embodiments for accepting a media connector during use and retention means for stabilizing the media connector, for example, are contemplated within the scope of the present invention and are more fully described in U.S. Pat. Nos. 5,183,404; 5,336,099; and 5,338,210. All three of these patents are expressly incorporated herein by reference.

The sliding interface electrical connector 12 comprises a pin block 46 for accommodating at least one conductive terminal or lead 48. In FIG. 3, six conductive leads being in substantially parallel arrangement are illustrated. Each conductive lead 48 has a first end 50 and a second end 52. It should be appreciated, however, that the conductive lead is preferably one singular conductive material and the first and second ends simply describe portions of the conductive lead 48 that extend beyond a boundary or support of pin block 46 on opposite sides thereof. Preferably, the conductive lead is inserted within and molded contiguously with the pin block 48 in a well known manufacturing technique often referred to as "insert molding."

The first end 50 of the conductive lead 48 is for making electrical contact with the media connector during use when the media connector is inserted into aperture 36. Preferably, the first end 50 extends at least partially into the aperture 36 for electrically contacting the necessary conductors of the media connector. The necessary conductors of an RJ-11 media connector usually include the "tip and ring" lines.

The second end 52 of the conductive lead 48 is for slidingly making electrical contact with a conductive track 18. The conductive track 18 is elongated and of sufficient length that allows for a sliding electrical contact of the second end 56 throughout the range of motion as the retractable access portion is extended beyond the housing of the computer, communication card, or other boundary.

Figure 5:
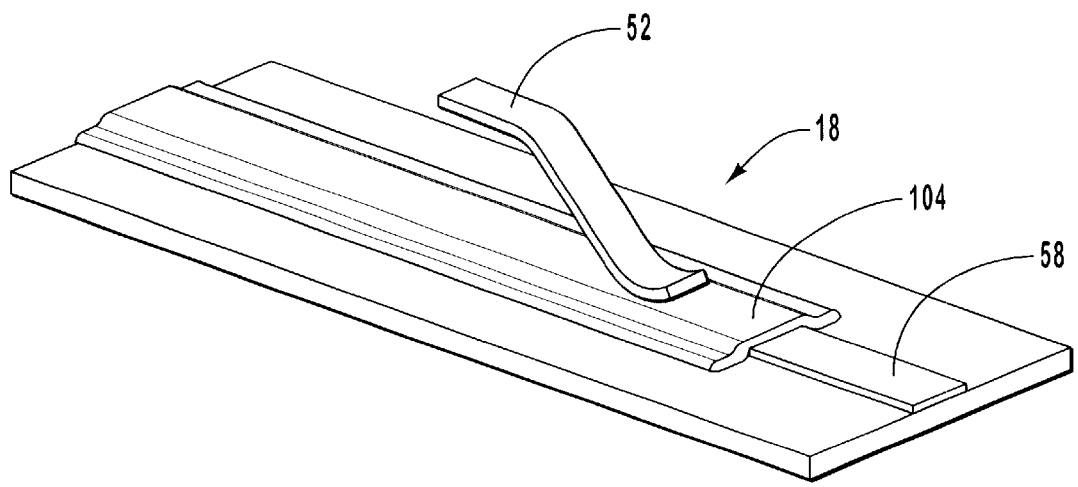
FIG. 5 depicts a detailed view of the sliding contact interface having a sliding carbon ink sealant, in accordance with a preferred embodiment of the present invention.

The profile of conductive track 18 is described in greater detail in FIG. 5, however, in general, conductive track 18 is comprised of a conductive trace 58 and a generally non-metallic electrically conductive trace sealant 104 (FIG. 5). Together, conductive trace 58 and non-metallic sealant 104 (FIG. 5) form an electrically conductive track onto which the also electrically conductive second end 52 of the conductive lead 48 slidably interfaces. The conductive trace 58 is preferably a metal, such as copper, silver, combinations thereof and similar other metals and metal combinations, but is not required.

The conductive track 18 is also of sufficient length to maintain electrical contact with the second end even when the retractable access portion 22 is inadvertently bumped during use and caused to slide in a direction generally towards the computer. When this inadvertent sliding occurs, the retractable access portion 22 is only able to travel towards the computer housing until the media connector, inserted in the aperture 36, is prevented from further travel as it abuts against the computer housing. Thus, if the inadvertent sliding of the retractable access portion 22 remains as a possibility, the conductive tracks only need to be of a length sufficient to electrically contact the second end 52 when the retractable access portion is fully extended and when the media connector, during use, is pushed and abutted against the housing.

It should be appreciated that since the conductive track 18 is in electrical communication with the fixed portion 24, the second end 52 is simultaneously in electrical communication with the fixed portion 24. In turn, the first end 50 of the conductive lead 48 is also in electrical communication with the fixed portion 24. Thus, during use, when conductive lines of the media connector electrically contact the first end 50, the media connector is in electrical communication with the computer via the fixed portion 24.

Figure 4:
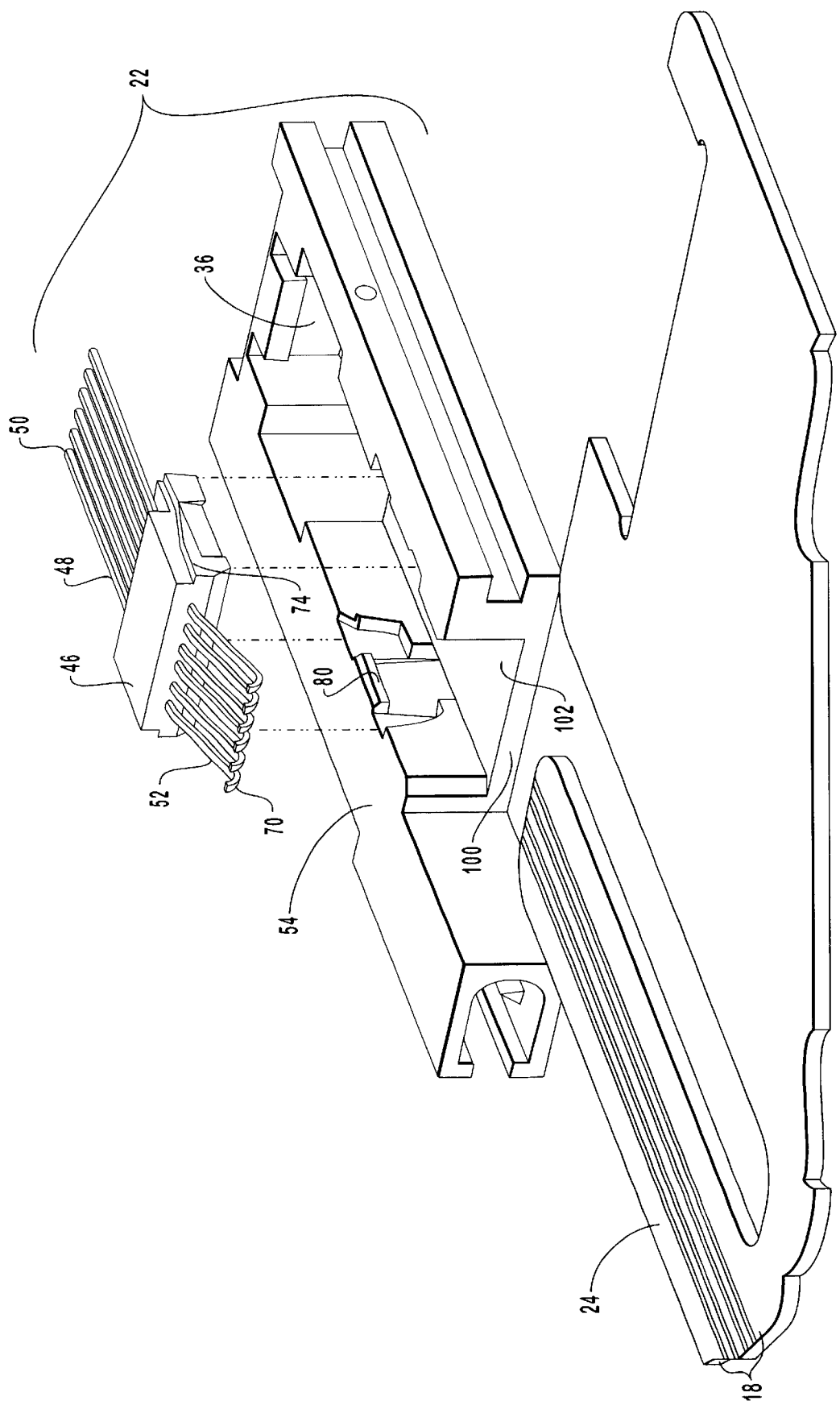
FIG. 4 is a side view of a portion of a sliding interface electrical connector depicting a pin block and electrical terminals having a non-metallic conductive sealant thereon for electrically contacting a media connector according to a preferred embodiment of the present invention.

FIG. 4 depicts an exploded view of the sliding interface electrical connector 12, in accordance with the present invention. The pin block 46 with included leads 48 including first ends 50 and second ends 52 are inserted into the retractable access portion frame 54 of retractable access portion 22. In this embodiment, the pin block 46 operably mates with frame 54 and is retained by the interfacing of a ledge 74 on the pin block 46 with a ridge 80 on frame 54. Also appreciated in this embodiment is a generally "J" shaped, curved terminal portion 70 of the second end 52. In this manner, the curved terminal portion 70 more easily slides along the conductive tracks 18 of the fixed portion 24.

Also depicted in FIG. 4 is the operative mating of fixed portion 24 with retractable access portion 22. While the second ends 52 of the leads 48 provide the sliding electrical interface with the conductive tracks 18 of the fixed portion 24, it should be apparent that the positive flexure of the second ends 52 on the conductive tracks 18 induce a natural deflection of the printed circuit board having the conductive tracks 18 thereon. In order to facilitate the sustained positive contact between the second ends 52 of the pin block 46 with the conductive tracks 18 of the fixed portion 24, frame 54 is further includes a printed circuit board support shelf 100 integral thereto with a sliding surface 102 for supporting the portion of fixed portion 24 having the conductive tracks 18 thereon that comprise the sliding interface electrical connector of the present invention.

FIG. 5 is a perspective cross-section view of the sliding interface electrical connector, in accordance with a preferred embodiment of the present invention. The conductive track 18 is comprised of a conductive metal trace 58 which is fabricated onto the printed circuit board as part of the wiring or interconnection structure of the printed circuit board. Conductive trace 58 is preferably metallic, such as copper or aluminum or other metallic combinations similar thereto. Generally, conductive traces 58 are comprised of low resistance, and therefore highly conductive, metallic compounds, and in high production applications, are comprised of reasonably priced metallic compounds, most generally copper and related alloys. Those of skill in the art appreciate, however, the relative ease with which some metals, such as copper, oxidize when they are exposed to an ambient air environment such as when conductive traces are placed on the external sides of printed circuit board 16.

As discussed above, prior implementations of slidable electrical interfaces incorporate plating, generally in the form of gold plating, onto the surfaces of conductive traces 58 to prevent oxidation of the conductive traces forming interconnections throughout the various circuit components. However, in the present invention, conductive traces 58 are sealed from ambient air oxidation by applying a carbon ink-based sealant 104 to conductive traces 58. In the preferred embodiment, sealant 104 is applied over the conductive trace 58 using techniques, an example of which is screen-printing techniques, known by those of skill in the art. As depicted in FIG. 5, the sealant 104 encapsulates the exposed surfaces of the conductive trace 58 on the top surface as well as the side portions of the conductive trace 58. Such encapsulation prevents oxides from forming on the conductive traces by providing a barrier for the conductive traces.

In the preferred embodiment, carbon ink is used for the sealant material and is applied according to the manufactures specification. While various carbon ink compositions may be employed, one preferred composition of carbon ink is Electra D' or ™ED5601 which is manufactured by Polymers & Chemicals AD of Roughway Mill, Tonbridge, Kent TN11 9SG, England. Other carbon ink compositions are also suitable for implementing the sliding interface electrical connector of the present invention and are contemplated to be within the scope of the present invention as claimed. The carbon ink sealant of the preferred embodiment exhibits an approximate resistance of 29–30 milliohms of resistance/square compared with gold plating which exhibits approximately 33 milliohms of resistance/square. Therefore, carbon ink sealant injects a series resistance, lower than gold plating, into the circuits, which in turn, lowers the negative effects on signal performance associated with increased series resistance.

Furthermore, the carbon ink of the preferred embodiment, exhibits a desirable improvement in hardness for the electrical sliding components of the sliding interface electrical connector of the present invention. In the preferred embodiment, the carbon ink sealant exhibits a hardness of 5H, on a pencil hardness scale, which is a significant improvement over gold plating which exhibits only a hardness of approximately 2H. The sliding interface electrical connector having carbon ink sealant also exhibits an improved friction coefficient as the carbon ink sealant is a self-lubricating finish as opposed to gold plating which exhibits scratching and marring after only a few hundred insertions. Additionally, the marring common to gold plating also results in an increase of series resistance and exposure to the underlying copper and or nickel prep layers.

Figure 6:
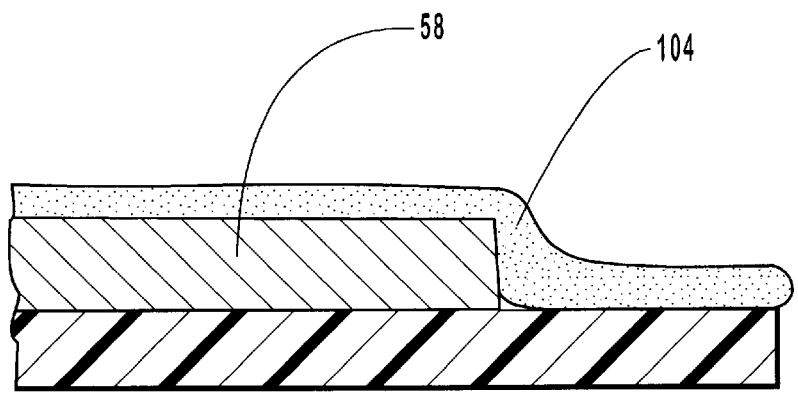
FIG. 6 is a cross-section profile of a conductive track of the slidable interface connector of the present invention.

FIG. 6 is a cross-sectional view of the conductive track used in the sliding interface electrical connector of the present invention. As shown, the conductive trace 58 assumes a largely rectangular profile needing sealing on both the top and sides of the conductive trace 58. Traditional gold plating results in a nearly uniform thickness of gold on both the top and sides of the conductive trace. However, the carbon ink based sealant 104 exhibits a conformal profile which is more conducive to accommodating minor misalignment of the second end 52 of pin block 46 (see FIG. 5). That is to say, the more accommodating slope of carbon ink sealant 104 allows the second end 52 of pin block 46 to return to the top of the sealed conductive trace upon operation of the sliding contact should mechanical tolerances within the sliding interface electrical connector result in slight misalignment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed and desired to be secured by United States Letters Patent is:

1. A retractable slidable communication connector for use in a communication device, comprising:

a. a retractable access portion having an aperture formed therein and configured to receive at least a portion of a media connector, said retractable access portion including:

i. a frame portion wherein said aperture is formed; and
ii. a conductive terminal having a first end and a second end, said first end for making electrical contact with said media connector during use; and
b. a fixed portion for providing electrical contact with an electric circuit within said communication device, said fixed portion including:
  i. a conductive track for slidingly making electrical contact with said second end of said conductive terminal during use as said retractable access portion is extended into an operative position, said conductive track comprising a conductive trace formed on a printed circuit board of said communication device and a non-metallic sealant disposed about at least a portion of said conductive trace forming a surface about which said second end of said conductive terminal forms said electrical contact.

2. The retractable slidable communication connector, as recited in claim 1, wherein said non-metallic sealant is comprised of conductive carbon ink.

3. The retractable slidable communication connector, as recited in claim 1, wherein said second end of said conductive terminal has a curved terminal portion thereof for facilitating said sliding electrical contact between said conductive terminal and said conductive track.

4. The retractable slidable communication connector, as recited in claim 1, wherein said conductive terminal on said retractable access portion extends and retract in parallel alignment with said conductive track.

5. The retractable slidable communication connector as recited in claim 1, wherein said conductive trace is comprised of a copper alloy affixed to said printed circuit board.

6. The retractable slidable communication connector as recited in claim 1, wherein said retractable access portion further comprises a shelf forming a sliding shelf on which said printed circuit board having said conductive tracks thereon slides to provide a positive electrical contact between said second end of said conductive terminal and said conductive track.

7. A communication module having a movable electrically-conductive interface, said module comprising:
a. a printed circuit board including a conductive track, comprising:
  i. an electrically conductive trace for providing electrical continuity to circuits in said communication module;
  ii. a non-metallic sealant disposed about at least a portion of said conductive trace to form an electrically conductive surface; and
b. a slidable member for extending from said communication module to receive a media plug for interfacing with said communication module, said slidable member including at least one conductive terminal having a first end and a second end, said first end for making electrical contact with said media connector during use and said second end for sliding about said electrically conductive surface of said conductive track to form said movable electrically-conductive interface.

8. A communication module according to claim 7, wherein said sealant is applied using a non-plating process.

9. A communication module according to claim 7, wherein said non-metallic sealant comprises conductive carbon ink.

10. A communication module according to claim 7, wherein said non-metallic sealant extends for the entire length of said conductive trace.

11. A direct connection system for removably engaging a media connector with a communications card, comprising:
a. a communications card having a retractable access portion and a fixed portion and said retractable access portion having an aperture formed therein to receive at least a portion of said media connector;
b. at least one conductive lead having a first end and a second end, said first end extending partially into said aperture for making electrical contact with said media connector during use; and
c. at least one conductive track for slidingly making electrical contact with said second end of said at least one conductive lead during use as said retractable access portion is extended, said at least one conductive track being in electrical communication with said fixed portion, said conductive track comprising a metallic conductive trace having an electrically conductive non-metallic sealant disposed thereabout, said second end of said at least one conductive lead being in direct physical contact with said non-metallic sealant.

12. The direct connection system, as recited in claim 11, wherein said non-metallic sealant is comprised of conductive carbon ink.

13. The direct connection system, as recited in claim 11, wherein said second end of said conductive terminal has a curved terminal portion thereof for facilitating said sliding electrical contact between said conductive terminal and said conductive track.

14. The direct connection system, as recited in claim 11, wherein said conductive terminal on said retractable access portion extends and retract in parallel alignment with said conductive track.

15. The direct connection system, as recited in claim 11, wherein said conductive trace is comprised of a copper alloy affixed to said printed circuit board.

16. The direct connection system, as recited in claim 15, wherein said retractable access portion further comprises a shelf forming a sliding shelf on which said printed circuit board having said conductive tracks thereon slides to provide a positive electrical contact between said second end of said conductive terminal and said conductive track.

* * * * *